United States Patent
Chang et al.

(10) Patent No.: US 11,075,618 B2
(45) Date of Patent: Jul. 27, 2021

(54) PULSE WIDTH MODULATION SIGNAL GENERATOR

(71) Applicant: uPI semiconductor corp., Zhubei (TW)

(72) Inventors: Chih-Lien Chang, Zhubei (TW); Chia-Chien Li, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 0 days.

(21) Appl. No.: 17/016,460

(22) Filed: Sep. 10, 2020

(65) Prior Publication Data
US 2021/0119613 A1    Apr. 22, 2021

(30) Foreign Application Priority Data
Oct. 18, 2019 (TW) .................................. 108213814

(51) Int. Cl.
  G06F 1/26    (2006.01)
  H03K 3/017   (2006.01)
  H03K 17/22   (2006.01)

(52) U.S. Cl.
  CPC .............. *H03K 3/017* (2013.01); *G06F 1/26* (2013.01); *H03K 17/22* (2013.01); *H03K 17/223* (2013.01)

(58) Field of Classification Search
  CPC ...... H03K 3/017; H03K 17/22; H03K 17/223; G06F 1/26
  See application file for complete search history.

(56) References Cited

U.S. PATENT DOCUMENTS 8,542,051 B2 * 9/2013 Ogawa ............... H03K 3/35613
                                                 327/333
8,638,080 B2   1/2014 Agrawal et al.
2013/0271101 A1 10/2013 Nanov

* cited by examiner

Primary Examiner — Jung Kim
(74) Attorney, Agent, or Firm — McClure, Qualey & Rodack, LLP

(57) ABSTRACT

A plus width modulation (PWM) signal generator is disclosed. The PWM signal generator includes a first signal generator providing a first signal, an output terminal, a first voltage generating circuit including connected to the first voltage generating circuit for providing a first present voltage according to the first signal, and a second voltage generating circuit connected to the first signal generator for providing a second present voltage according to the first signal. The first present voltage is earlier supplied to the output terminal than the second preset voltage, and after the first preset voltage continuously is provided for a period of preset time, the first voltage generating circuit stops providing the first preset voltage.

6 Claims, 3 Drawing Sheets

PULSE WIDTH MODULATION SIGNAL GENERATOR

BACKGROUND

Technical Field

The present invention generally relates to a pulse width modulation signal generator, and specifically, the present invention relates to a pulse width modulation signal generator that can provide pulse width modulation signals with two different high-level voltages.

Related Art

In the prior art power supply, to match the application of different drivers, the controller needs to support the high-level voltage of output of pulse width modulation signals with 3.3V or 5V. If the prior art controller would like to achieve the above-mentioned output voltage at the same time, it is usually necessary to add new pin to receive different power supplies from the outside, as shown in FIG. 1, which is a power supply of the prior art. As shown in FIG. 1, the pulse width modulation (hereinafter referred to as PWM) generator 11 includes a PWM logic circuit 111 and an output stage 112. The PWM logic circuit 111 provides the signal PONB to the output stage 112, so that the output stage 112 provides the PWM signal to the driver or the driver-MOSFET (DrMOS) through the output terminal Q. If the output stage 112 needs to provide a voltage of 3.3V, an additional pin needs to be connected to an external voltage of 3.3V. However, if a low-dropout regulator (LDO) or other step-down circuit is used to convert the 5V operating voltage $V_{DD}$ to the 3.3V PWM output voltage, a large amount of additional area is required, and this structure fixes the high-level voltage of PWM by using a buffer, which will cause the PWM waveform turning high too slow and that is harmful to high-frequency switching applications.

SUMMARY

One purpose of the present invention is to provide a pulse width modulation signal generator that can provide pulse width modulation signals with two different high-level voltages of 3.3V and 5V.

In one embodiment, the pulse width modulation signal generator of the present invention includes a first signal generator that provides a first signal, an output terminal, a first voltage generating circuit that includes a voltage division circuit and is coupled to the first signal generator and the output terminal, provides a first preset voltage to the output terminal according to the first signal and the voltage division circuit; a second voltage generating circuit, which is coupled to the first signal generator and the output terminal, provides the second preset voltage to the output terminal according to the first signal. In a signal period of the first signal, the first preset voltage is provided to the output terminal earlier than the second preset voltage, and after the first preset voltage is continuously provided for a period of the preset time, the first preset voltage generating circuit stops providing the first preset voltage.

In one embodiment, the value of the first preset voltage is equal to the value of the second preset voltage after the preset time.

In one embodiment, the first voltage generating circuit also includes a pulse generator, the pulse generator receives the first signal for enabling the voltage division circuit and lasting the period of preset time.

In one embodiment, the second voltage generating circuit further includes a clamping circuit, the clamping circuit includes an operational amplifier and a first transistor for generating a second preset voltage.

In one embodiment, the second voltage generating circuit also includes a source follower circuit, the source follower circuit includes a first switch and a first transistor that matches to a second transistor, the control terminal of the second transistor is coupled to the output terminal of the operational amplifier, the first switch is coupled to the second transistor that receives the first signal for controlling the output of the second voltage.

In one embodiment, the pulse width modulation signal generator further includes the second output stage and the second signal generator, the source follower circuit is coupled to the second output stage and the second signal generator, and output the second preset voltage to the second output stage according to the second signal provided by the second signal generator.

Compared with the prior art, the pulse width modulation signal generator of this invention can provide pulses width modulation signal with two different high-level voltages 3.3V (first preset voltage and/or second preset voltage) and 5V (working voltage) to the driver and without additional power pins or additional power supply circuits, the cost is lower. On the other hand, the pulse width modulation signal generator of the present invention can be turning the status quickly, and is in line with the trend of high-frequency applications.

DETAILED DESCRIPTION

Figure 1:
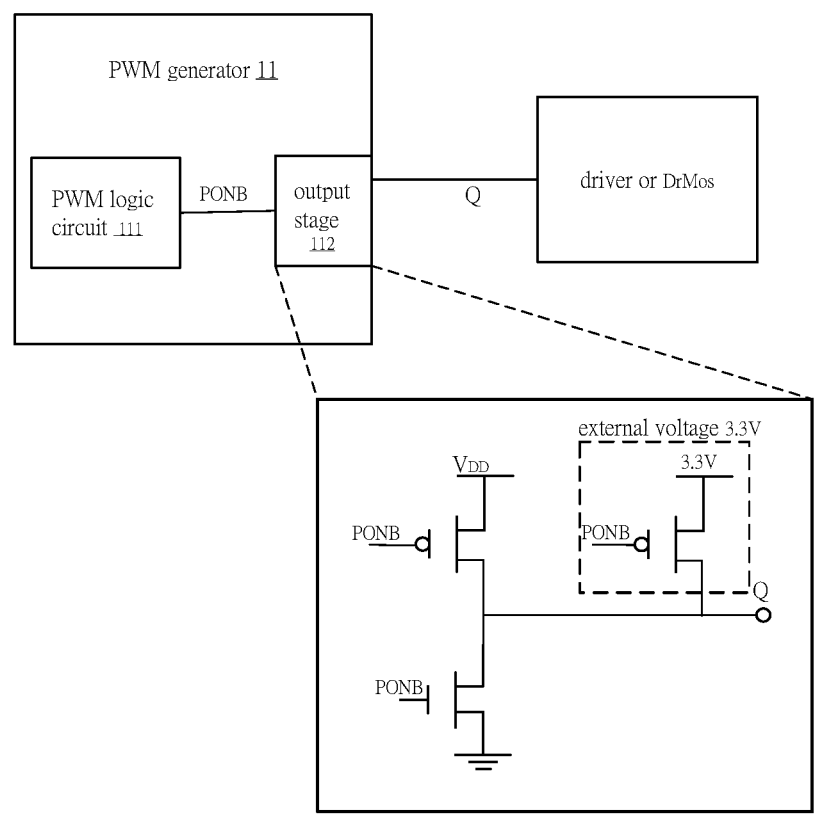
FIG. 1 shows the power supply of the prior art.
Figure 2:
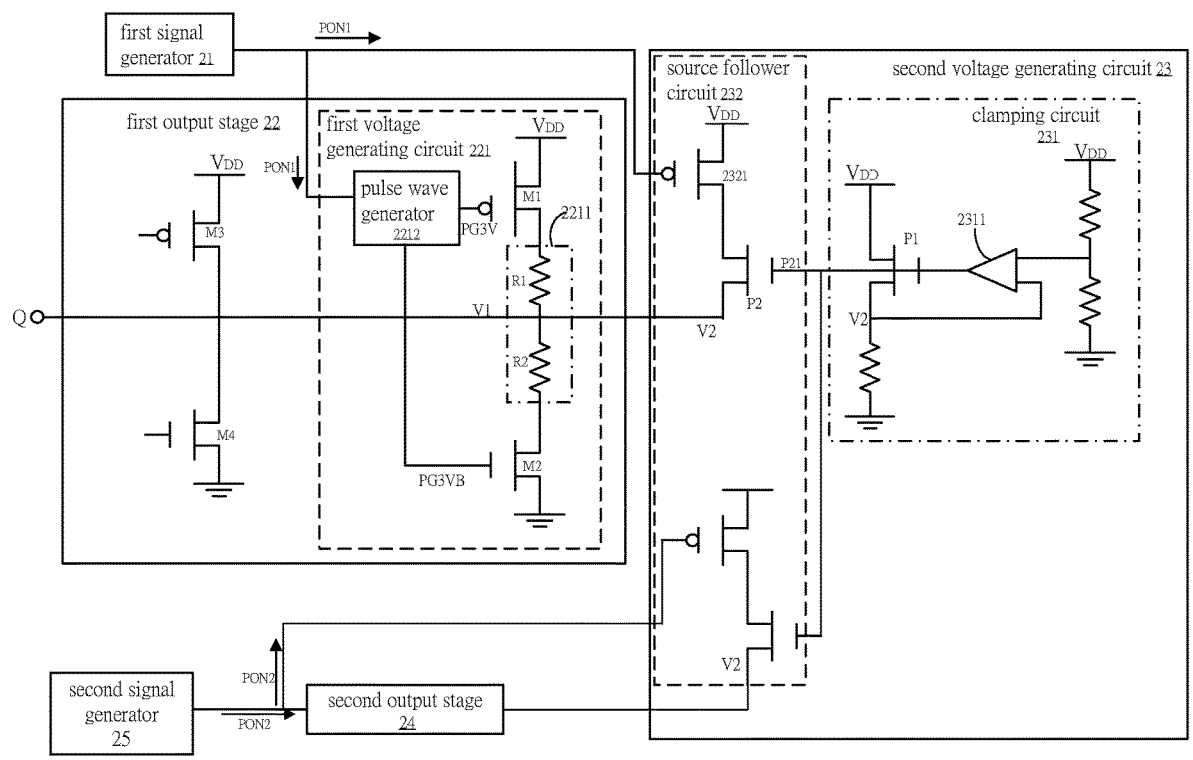
FIG. 2 shows a schematic diagram of the pulse width modulation signal generator according to an embodiment of the present invention.

FIG. 2 is a schematic diagram of the pulse width modulation signal generator according to an embodiment of the present invention, which includes a first signal generator 21, an output terminal Q, a first voltage generating circuit 221 and a second voltage generating circuit 23, as shown in FIG. 2. The first signal generator 21 provides a first signal PON1, the first signal generator 21 is a pulse width logic circuit. The first voltage generating circuit 221 includes a voltage division circuit 2211 that is coupled to the first signal generator 21 and the output terminal Q, and provides the first preset V1 to the output terminal Q according to the first signal PON1 and the voltage division circuit 2211. The second voltage generating circuit 23 is coupled to the first signal generator 21 and the output terminal Q, and provides the second preset voltage V2 to the output terminal Q according to the first signal PON1. In addition, the first preset voltage V1 is provided to the output terminal Q earlier than the second preset voltage V2, and after the first preset voltage V1 is continuously provided for a period of the preset time, the first voltage generating circuit 221 stops providing the first preset voltage V1.

The first voltage generating circuit 221 includes a pulse generator 2212 and a voltage division circuit 2211. The pulse generator 2212 is coupled to the first signal generator 21 and receives the first signal PON1 to enable the voltage division circuit 2211 for a period of the preset time. The voltage division circuit 2211 is coupled between the working voltage $V_{DD}$ and the ground voltage for generating the first preset voltage V1. The first voltage generating circuit 221 further includes a first switching element M1 and a second switching element M2, and the voltage division circuit 2211 is disposed between the first switching element M1 and the second switching element M2. The control terminal of the first switching element M1 and the second switching element M2 are coupled to the pulse generator 2212 and control the duration of the first preset voltage V1 according to the pulse signals PG3V and PG3VB. In this embodiment, the first voltage generating circuit 221, the third switching element M3, and the fourth switching element M4 constitute the first output stage 22.

The purpose of the third switching element M3 is to make the output terminal Q provide the high-level voltage as the pulse width modulation signal of the operating voltage $V_{DD}$. When the output terminal Q needs to provide high-level voltage as the pulse width modulation signal of the $V_{DD}$, the third switching element M3 is used by such as the method of the fuse blowing and the first voltage generating circuit 221 and the second voltage generating circuit 23 are disabled.

The second voltage generating circuit 23 includes a clamping circuit 231 composed of an operational amplifier 2311 and a first transistor P1 for generating a second preset voltage V2. The second voltage generating circuit 23 further includes a source follower circuit 232, which is coupled between the operational amplifier 2311 and the output terminal Q, and outputs a second preset voltage V2 according to the first signal PON1. The source follower circuit 232 is also coupled to the second output stage 24 and the second signal generator 25, and outputs the second preset voltage V2 to the second output stage 24 according to the second signal PON2 provided by the second signal generator 25.

The source follower circuit 232 includes a first switch 2321 and a second transistor P2 matching with the first transistor P1. The first switch 2321 is coupled to the second transistor P2 and receives the first signal PON1 for controlling the output of the second voltage V2. The control terminal P21 of the second transistor P2 is coupled to the output terminal of the operational amplifier 2311. Because the second transistor P2 matches the first transistor P1, and both of its gates are coupled to the output terminal of the operational amplifier 2311, one terminal of both are coupled to the working voltage $V_{DD}$, under the condition of both terminals of voltage are fixed, the other terminal will also generate the same second preset voltage V2.

In a multi-phase application, the source follower circuit 232 can also be coupled to the second output stage 24 and the second signal generator 25 for generating a pulse width modulation signal of another phase. The second signal generator 25 is a pulse width modulation logic circuit of the another phase, and the source follower circuit 232 outputs the second preset voltage V2 to the second output stage 24 according to the second signal PON2 provided by the second signal generator 25, which is used to generate the pulse width modulation signal of the another phase. The content and operation of the second output stage 24 can be the same as the first output stage 22, so will not repeat them here.

Figure 3:
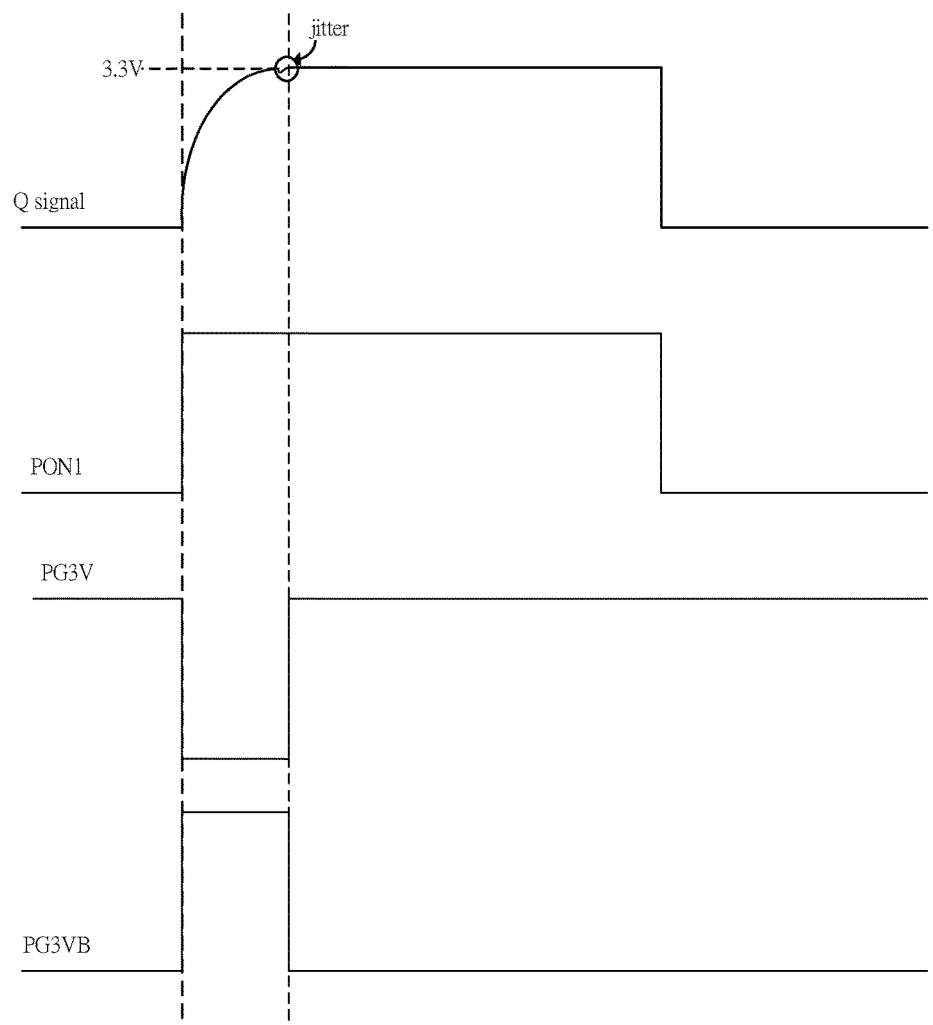
FIG. 3 shows a schematic diagram of the signal wave form according to an embodiment of the present invention.

FIG. 3 is a schematic diagram of signal waveforms according to an embodiment of the present creation. Please refer to FIG. 2 and FIG. 3, when the first signal PON1 turns to the high level, the pulse generator 2212 will be triggered to generate a pair of square wave signal PG3V and PG3VB to conduct the paths of the voltage division circuit 2211, the working voltage $V_{DD}$ and the ground voltage, so as to generate the first preset voltage V1 in the way of the resistance voltage divider, and quickly pull the signal of the output terminal Q to the high voltage level, that is, the first preset voltage V1. At the same time, the first switch 2321 in the second voltage generating circuit 23 receives the first signal PON1 and turns on, connects to the transistor P2 and the working voltage $V_{DD}$, so that the output voltage of the second voltage generating circuit 23 at the output terminal Q starts to be pulled up. Within the duration of the square wave signals PG3V and PG3VB, the signal level of the output terminal Q has been pulled to 3.3V (the first preset voltage V1), and the first preset voltage V1 continues to be used as the signal of the output terminal Q. After the duration of the square wave signals PG3V and PG3VB expire, the output voltage of the second voltage generating circuit 23 at the output terminal Q has been pulled up to the level of the second preset voltage V2. At this time, the supply of the first preset voltage V1 is interrupted, and the output voltage level of the second voltage generating circuit (the second preset voltage V2) continues to maintain the voltage level of the output terminal Q. In practice, during the transfer of two preset voltages, the voltage level of the output terminal Q may produce a small amount of jitter (ripper).

The pulse width modulation signal generator of the present invention enables the voltage division circuit through the pulse signal to divide the working voltage into a lower potential, so as to quickly pull the voltage up to the required level when the pulse width modulation signal changes from a low level to a high level. Since the voltage division circuit consumes a large amount of current, the voltage is continuously fixed through the second voltage generating circuit to maintain the stability of the high-level voltage of the pulse width modulation signal.

The pulse width modulation signal generator of the present invention enables the switching element connecting the operating voltage and the output terminal in the output stage when the high-level voltage of the pulse width modulation signal is the working voltage level of 5V, and disables the first voltage generating circuit and the second voltage generating circuit. When the high-level voltage of the pulse width modulation signal is 3.3V, the first voltage generating circuit with fast transition speed is combined with the second voltage generating circuit with lower energy consumption to generate the high level signal 3.3V from the working voltage of 5V, so that the transition current consumption and transition speed of the pulse width modulation signal are within the allowable range, no additional pins are required to connect to a 3.3V power supply or an additional power supply circuit.

Furthermore, the present invention is used in multi-phase applications. The multiple phases can be connected through a source follower circuit. Only one second voltage generating circuit can support the output of multiple sets of pulse width modulation signals, which greatly saves circuits area.

The above-mentioned related embodiments have been described, but the above-mentioned embodiments are only examples for implementing this present invention. It must be pointed out that the disclosed embodiments do not limit the scope of this present invention. On the contrary, all modifications and equalization of the spirit and scope included in the scope of the patent application are included in the scope of this creation.

What is claimed is:

1. A pulse width modulation signal generator, comprising:
a first signal generator, providing a first signal;

an output terminal;
a first voltage generating circuit, comprising a voltage division circuit, and coupled to the first signal generator and the output terminal, providing a first preset voltage to the output terminal according to the first signal and the voltage division circuit; and
a second voltage generating circuit, coupled to the first signal generator and the output terminal, and providing a second preset voltage to the output terminal according to the first signal,
wherein, the first preset voltage is provided to the output terminal earlier than the second preset voltage, and after the first preset voltage is continuously provided for a period of preset time, the first voltage generating circuit stops providing the first preset voltage;
wherein when the first voltage generating circuit and the second voltage generating circuit are disabled, the pulse width modulation signal generator provides a high-level voltage to the output terminal.

2. The pulse width modulation signal generator according to claim 1, wherein the value of the first preset voltage is equal to the value of the second preset voltage after the preset time.

3. The pulse width modulation signal generator according to claim 1, wherein the first voltage generating circuit further includes a pulse generator, the pulse generator receives the first signal to enable the voltage division circuit and lasting the period of preset time.

4. The pulse width modulation signal generator according to claim 1, wherein the second voltage generator also includes a clamping circuit, the clamping circuit comprises an operational amplifier and a first transistor for generating the second preset voltage.

5. The pulse width modulation signal generator according to claim 4, wherein the second voltage generating circuit also includes a source follower circuit, the source follower circuit includes a first switch and a second transistor that is matching to the first transistor, the control terminal of the second transistor is coupled to an output terminal of the operational amplifier, and the first switch is coupled to the second transistor and receives the first signal for controlling the output of the second voltage.

6. The pulse width modulation signal generator according to claim 5, further comprising a second output stage and a second signal generator, wherein the source follower circuit is coupled to the second output stage and the second signal generator, and outputs the second preset voltage to the second output stage according to a second signal provided by the second signal generator.

* * * * *